(12) United States Patent
Wang et al.

(10) Patent No.: US 10,872,941 B2
(45) Date of Patent: Dec. 22, 2020

(54) DISPLAY PANEL, MANUFACTURE METHOD THEREOF AND DISPLAY DEVICE

(71) Applicant: BOE TECHNOLOGY GROUP CO., LTD., Beijing (CN)

(72) Inventors: Pinfan Wang, Beijing (CN); Pohsien Wu, Beijing (CN); Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/518,246

(22) Filed: Jul. 22, 2019

(65) Prior Publication Data

US 2020/0027936 A1    Jan. 23, 2020

(30) Foreign Application Priority Data

Jul. 20, 2018 (CN) .......................... 2018 1 0805652

(51) Int. Cl.
*H01L 51/52* (2006.01)
*H01L 27/32* (2006.01)
*G03F 7/09* (2006.01)

(52) U.S. Cl.
CPC .......... *H01L 27/3246* (2013.01); *G03F 7/094* (2013.01)

(58) Field of Classification Search
CPC ............................ H01L 51/5225; H01L 51/56
See application file for complete search history.

(56) References Cited

U.S. PATENT DOCUMENTS

| | | | |
|---|---|---|---|
| 2009/0009069 A1 | 1/2009 | Takata | |
| 2009/0173529 A1 | 7/2009 | Lee et al. | |
| 2014/0138637 A1 | 5/2014 | Yang et al. | |
| 2016/0104756 A1 | 4/2016 | Lee et al. | |
| 2016/0190389 A1 | 6/2016 | Lee et al. | |
| 2016/0211483 A1 | 7/2016 | Kwon | |
| 2016/0260927 A1 | 9/2016 | Oh et al. | |
| 2017/0249886 A1 | 8/2017 | Choi | |
| 2017/0278920 A1 | 9/2017 | Park et al. | |
| 2017/0288168 A1 | 10/2017 | Kim et al. | |
| 2018/0097047 A1* | 4/2018 | Jung | ................... H01L 27/3258 |
| 2019/0067390 A1 | 2/2019 | Gao | |

FOREIGN PATENT DOCUMENTS

| | | |
|---|---|---|
| CN | 104769719 A | 7/2015 |
| CN | 107240596 A | 10/2017 |
| CN | 107565048 A | 1/2018 |
| TW | I370714 A | 8/2012 |

OTHER PUBLICATIONS

Office Action of CN Application No. 201810805652.0 and translation, dated Mar. 5, 2020, 11 pages.

* cited by examiner

*Primary Examiner* — Thomas L Dickey
(74) *Attorney, Agent, or Firm* — Muncy, Geissler, Olds & Lowe, P.C.

(57) ABSTRACT

A display panel is provided, which includes a substrate, multiple light emitting structures arranged in an array on the substrate, a blocking structure at least arranged in a peripheral region of the substrate, and a cathode layer arranged on the multiple light emitting structures and the blocking structure. The cathode layer is discontinuous at a location corresponding to the blocking structure.

19 Claims, 9 Drawing Sheets

DISPLAY PANEL, MANUFACTURE METHOD THEREOF AND DISPLAY DEVICE

CROSS-REFERENCE TO RELATED APPLICATION

This application claims a priority to Chinese Patent Application No. 201810805652.0 filed on Jul. 20, 2018, the disclosure of which is incorporated in its entirety by reference herein.

TECHNICAL FIELD

The present disclosure relates to the field of display technology, in particular to a display panel, a method for manufacturing the same and a display device.

BACKGROUND

With the development of information society, display devices for displaying images are faced with improved requirements. Recently, various types of flat panel display devices have been developed, such as liquid crystal display, plasma display device, organic light emitting display and electrophoresis display. In recent years, ongoing reaches are being conducted to implement the flat panel device, such as organic light emitting display or electrophoresis display, into a flexible display with flexibility.

In early display panel designing, a circuit board is arranged on a rigid substrate generally, forming a rigid panel. With the progress of science and technology, flexible panels that can be bended have been developed by those skilled in the art on the basis of the rigid panel. In practical application, there is a certain limitation with the flexible panel. In view of this, coplanar and noncoplanar stretchable panels are developed by those skilled in the art.

SUMMARY

In a first aspect, a display panel is provided according to some embodiments of the present disclosure, which includes: a substrate; multiple light emitting structures arranged in an array on the substrate; a blocking structure, at least arranged in a peripheral region of the substrate; and a cathode layer, arranged on the multiple light emitting structures and the blocking structure, where the cathode layer is discontinuous at a location corresponding to the blocking structure.

In a second aspect, a display device is further provided according to some embodiments of the present disclosure, which includes the display panel according to the first aspect.

In a third aspect, a method for manufacturing a display panel is further provided according to some embodiments of the present disclosure, which includes: forming multiple light emitting structures in an array on a substrate; forming a blocking structure, where the blocking structure is at least arranged in a peripheral region of the substrate; and forming a cathode layer on the multiple light emitting structures and the blocking structure, where the cathode layer is discontinuous at a location corresponding to the blocking structure.

BRIEF DESCRIPTION OF THE DRAWINGS

To facilitate understanding of aspects and advantages of the present disclosure, descriptions are provided hereinafter in conjunction with the drawings.

2

FIG. 7($a$) is a sectional view of a blocking structure according to some embodiments of the present disclosure;

FIG. 7($b$) is a sectional view of a blocking structure according to some embodiments of the present disclosure;

DETAILED DESCRIPTION

Embodiments of the present disclosure are described in detail hereinafter, examples of which are illustrated in the accompanying drawings. The embodiments described hereinafter with reference to the accompanying drawings are intended to be illustrative only, and are not to be construed as limiting the present disclosure.

Those skilled in the art will appreciate that unless, otherwise specified, the singular forms "a", "an", "the" may also be intended as plural. It is to be understood as well that the term "comprise" indicates presence of the features, integers, steps, operations, components and/or assemblies, but does not exclude presence or addition of one or more other features, integers, steps, operations, components, assemblies and/or combinations thereof. It should be understood that when an element is referred to as being "connected" to another element, it may be directly connected to the other element, or there may be an intermediate element therebetween. In addition, "connected" as used herein may indicate a wireless connection. The term "and/or" used herein indicates all or any one and all combinations of one or more of the associated items listed.

Those skilled in the art will appreciate that unless otherwise defined, all terms (including technical and scientific terms) used herein have the same meaning as commonly understood by those skilled in the art to which this disclosure pertains. It should also be understood that terms such as those defined in a general dictionary should be understood to have meanings consistent with the meaning in the context of the related technologies, and will not be interpreted as having idealized or too formal meanings unless specifically defined as here.

Applicant has discovered that in order to provide a structure with which a display panel is not broken during stretching, a novel packaging structure that separates each pixel structure is required. In general, since the top of the light-emitting structure cannot achieve effective packaging, moisture can erode from the top of the light-emitting structure to the inside of the island of the stretchable display panel, thereby oxidizing the light-emitting layer. In addition, the substrate and the packaging layer are subject to defect caused by the strain, and therefore, the substrate and the packaging layer cannot achieve effective packaging, due to which moisture can erode from the bottom of the light-emitting structure to the light-emitting layer, thereby further oxidizing the light-emitting layer.

Applicant has also found that each of the light-emitting structures disposed on the substrate in the related technologies needs to be separately encapsulated, and in the packaging process of the related technologies, it is required to completely encapsulate the light-emitting layer, the thin film transistor, the substrate, and other components, which results in the need for a larger space for packaging, thereby failing to meet the design requirements of narrow bezel, increasing the difficulty of the packaging process and the manufacturing cost, and making it hard to achieve a high-resolution pixel-level packaging structure.

Figure 1:
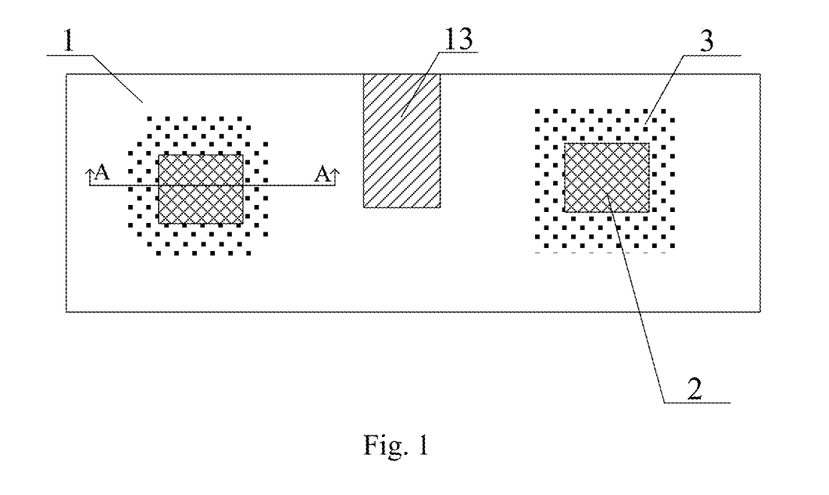
FIG. 1 is top view of a display panel with no blocking structure.
Figure 2:
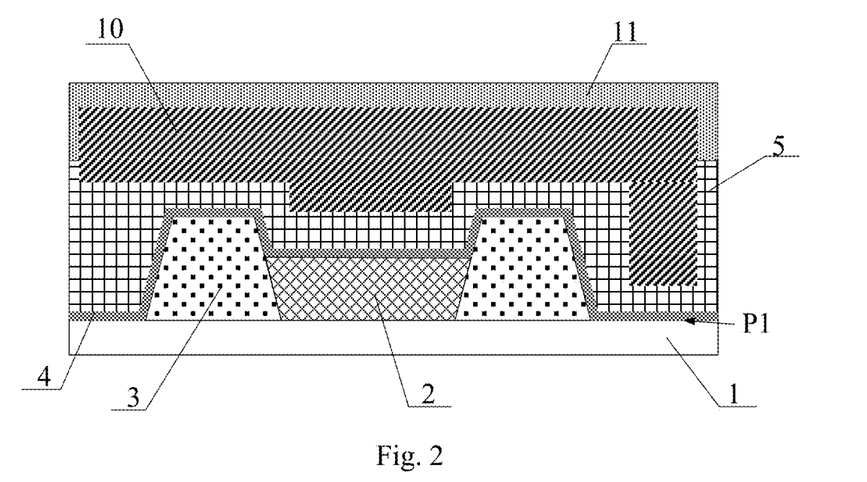
FIG. 2 is a sectional view taken along line A-A of FIG. 1.

Applicant has further found that the water and oxygen blocking performance of the display panel in the related technologies is poor. FIG. 1 shows a top view of a display panel in the related technologies. For detailed description of the structure therein, a cathode layer and a packaging layer disposed on the top of a light emitting structures 2 are not shown in FIG. 1. As shown in FIG. 1, two light emitting structures 2 spaced apart from each other are disposed on a substrate 1, and a pixel defining layer 3 is disposed around the light emitting structure 2 for defining the position of the light-emitting structure 2. An opening 13 is provided between the two light emitting structures 2 for increasing the overall elasticity of the stretchable panel. FIG. 2 shows a sectional view taken along line A-A of FIG. 1, in which a cathode layer 4 and a packaging layer for encapsulating the light emitting structure 2 are shown.

As shown in FIG. 2, the pixel defining layer 3 is provided on the substrate 1, and the light emitting structure 2 is disposed in a region surrounded by the pixel defining layer 3, that is, the pixel defining layer 3 is located in a peripheral region of the light emitting structure 2. The cathode layer 4 is disposed on the substrate 1, the light emitting structure 2 and the pixel defining layer 3, and the packaging layer is disposed on the cathode layer 4 and covers the substrate 1. The packaging layer includes multiple inorganic and organic layers which are alternately stacked, where only a first inorganic layer 5, a first organic layer 10 and a second inorganic layer 11 which are stacked are shown in FIG. 2.

Applicant has also found that the cathode material used in the related technologies is sensitive to water and oxygen, which tends to cause poor electrical conductivity, and the cathode material is a non-dense (non-watertight) metal, due to which oxidation rapidly spreads inward. Therefore, due to the continuity of the cathode layer 4, such a structural design in the related technologies causes moisture to enter the island including the light emitting structure 2 and the pixel defining layer 3 along the first water-oxygen erosion path P1 in FIG. 2, resulting in poor water and oxygen blocking performance of the display panel.

In view of the above, a display panel, a method for manufacturing a display panel and a display device are provided according to some embodiments of the present disclosure to address the technical problems due to poor packaging in the related technologies. The embodiments of the present disclosure are described in detail hereinafter in conjunction with the drawings.

Figure 3:
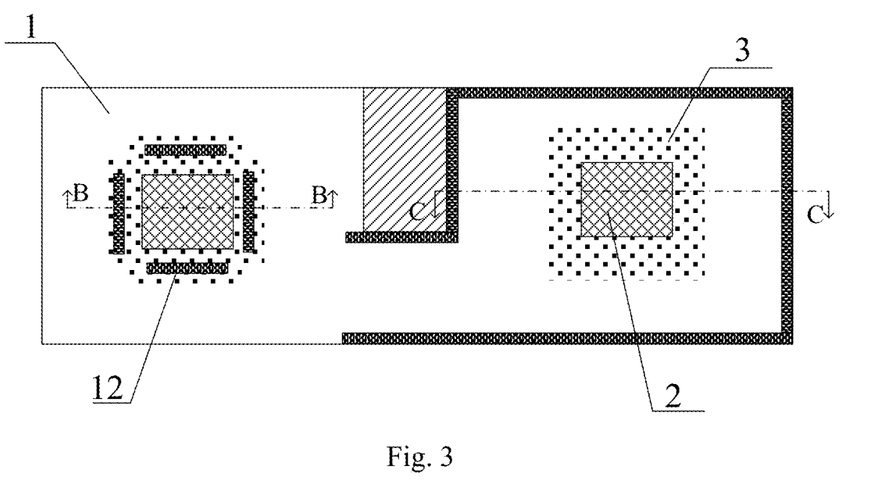
FIG. 3 is a top view of a blocking structure according to some embodiments of the present disclosure.
Figure 4:
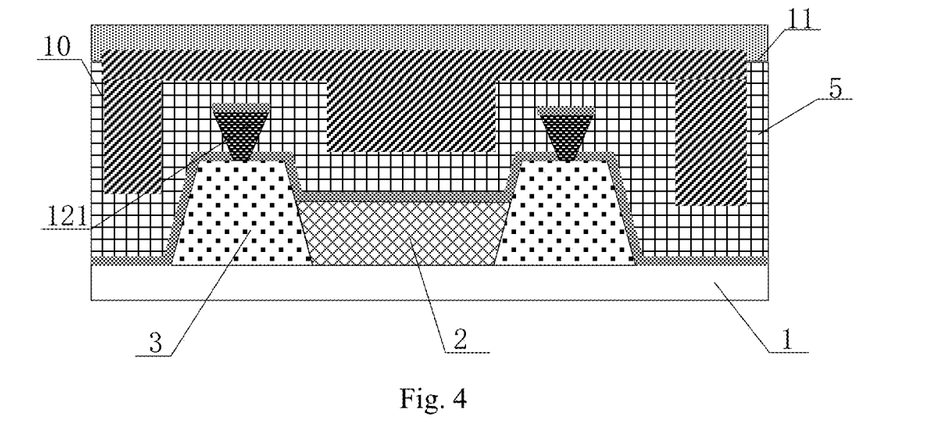
FIG. 4 is sectional view taken along line B-B of FIG. 3.
Figure 5:
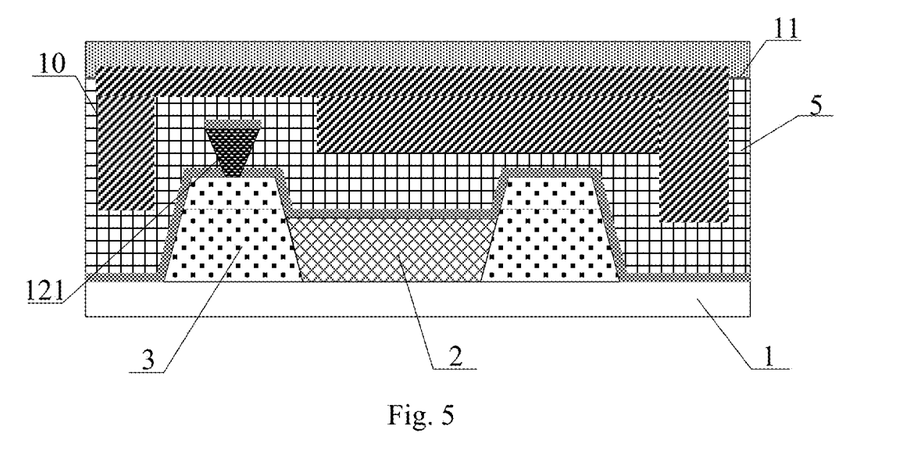
FIG. 5 is a sectional view of a blocking structure according to some embodiments of the present disclosure.

As shown in FIG. 3 to FIG. 5, a display panel is provided according to some embodiments of the present disclosure, which includes: a substrate 1; multiple light emitting structures 2 arranged in an array on the substrate 1; a blocking structure 12, at least arranged in a peripheral region of the substrate 1; and a cathode layer 4, arranged on the multiple light emitting structures 2 and the blocking structure 12, where the cathode layer is discontinued by the blocking structure 12 at the blocking structure 12.

The blocking structure is provided in the display panel of the embodiments of the present disclosure, the blocking structure is located at least in the peripheral region of the substrate and the cathode layer is discontinuous at a location corresponding to the blocking structure. Compared with the related technologies, the blocking structure can block the water-oxygen erosion path in the related technologies, improve the water and oxygen blocking performance of the display panel, and enhance the overall packaging performance of the display panel without damaging the elasticity of the display panel and the packaging space of each light emitting structure. In addition, a high-resolution pixel-level packaging structure can be achieved, thereby meeting the design requirements of narrow bezel.

The display panel according to some embodiments of the present disclosure may be, for example but not limited to, a stretchable display panel.

In some embodiments, the blocking structure 12 includes a first blocking structure 121 disposed in peripheral regions of at least some of the light emitting structures 2, as shown in FIG. 4. Only one light emitting structure 2 is shown in FIG. 4. In some embodiments, the first blocking structure 121 may be disposed in peripheral regions of all the light emitting structure 2. The specific arrangement of the blocking structure 12 may be set as needed in practical production.

Figure 6:
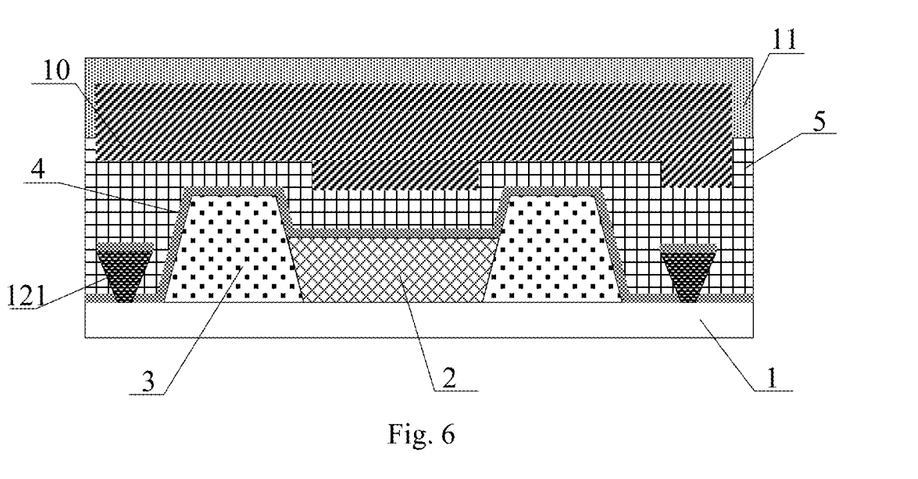
FIG. 6 is a sectional view taken along line C-C of FIG. 3.

In some embodiments, as shown in FIG. 4, the first blocking structure 121 may be disposed on the pixel defining layer 3 at the four sides of the light emitting structure 2. In some other embodiments, as shown in FIG. 5, the first blocking structure 121 may be disposed on the pixel defining layer 3 only at some of the four sides of the light emitting structure 2, for example, only disposed at one side of the light emitting structure 2, or only disposed at two sides of the light emitting structure 2, or only disposed at three sides of the light emitting structure 2. Further, in some embodiments, as shown in FIG. 6, the first blocking structure 121 may also be disposed around the pixel defining layer 3, for example, disposed on the substrate 1.

In some embodiments, in order to break the cathode layer 4 to prevent the continuous cathode layer 4 from forming a water-oxygen erosion path, an orthographic projection area of a top surface of the blocking structure 12 onto the substrate 1 is larger than an orthographic projection area of a bottom surface of the blocking structure 12 onto the substrate 1.

In some embodiments, a cross-sectional shape of the blocking structure 12 may be, for example, an inverted trapezoid, and in practical designing, the cross-sectional shape of the blocking structure 12 may be a structure such as a columnar structure having a mushroom head.

In some embodiments, the blocking structure 12 may be made of photoresist, and in practical production, the blocking structure 12 may be made of other organic materials, which is not limited herein.

Figure 7A:
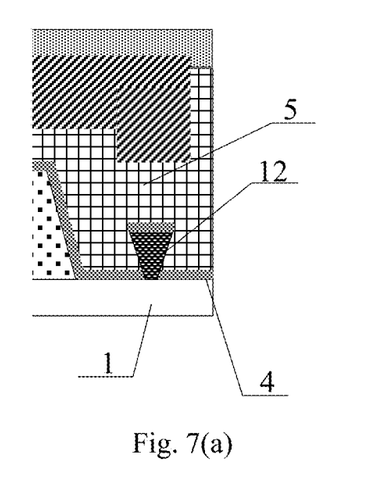
Figure 7B:
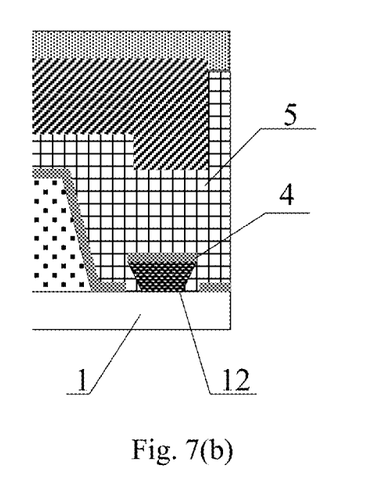

In some embodiments, the cathode layer 4 is in contact with a side wall of the blocking structure 12, as shown in FIG. 7(a); or, in some other embodiments, there is a gap between the cathode layer 4 and the sidewall of the blocking structure 12, as shown in FIG. 7(b).

Referring to FIG. 7(a), in a case that the side wall of the inverted-trapezoidal blocking structure 12 is steep, for example, an angle between the side wall and the horizontal plane is 70 or 80 degrees, the cathode layer 4 is in contact with the side wall of the blocking structure 12 and the blocking structure 12 with a steep side wall can be more easily manufactured in practical production. The arrangement of the blocking structure 12 discontinues the cathode layer 4, and even when the cathode layer 4 exterior to the blocking structure 12 (for example, the cathode layer 4 at the right side of the blocking structure 12 in FIG. 7(a)) and the substrate 1 are separated due to poor adhesion, the separation will not spread to a region of an island including the light emitting structure 2 and the pixel defining layer, that is, the cathode layer 4 interior to the blocking structure 12 (for example, the cathode layer 4 at the left side of the blocking structure 12 in FIG. 7(a)) will not separate from the substrate 1, enhancing the adhesion of the cathode layer 4. Therefore, the arrangement of the blocking structure 12 can not only block the water-oxygen erosion path, but also enhance the adhesion of the film layer of the display panel.

Further, referring to FIG. 7(b), in a case that the side wall of the inverted-trapezoidal blocking structure 12 is relatively gentle, for example, the angle between the side wall and the horizontal plane is 30 or 40 degrees, there is a gap between the cathode layer 4 and the side wall of the blocking structure 12. Compared with the arrangement shown in FIG. 7(a), in a case that the water and oxygen blocking performance of the blocking structure 12 is not very good, the water-oxygen erosion path can be further blocked by the gap between the cathode layer 4 and the side wall of the blocking structure 12, thereby further enhancing the packaging performance.

Specifically, the display panel according to some embodiments of the present disclosure further includes a planarization layer 14 and a pixel defining layer 3. The planarization layer 14 is located between the substrate 1 and the light emitting structures 2, and the pixel defining layer 3 may be located on the planarization layer 14 and in the peripheral region of the light emitting structure 2. The specific arrangement of the planarization layer 14 and the pixel defining layer 3 is similar to the related technologies, which is not described herein again.

Figure 17:
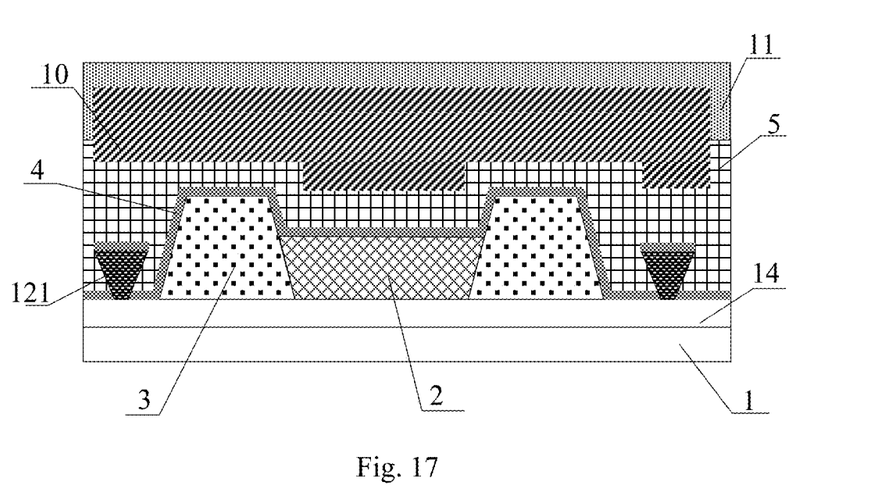
FIG. 17 is a sectional view of a display panel according to some embodiments of the present disclosure.

In some embodiments, as shown in FIG. 17, the first blocking structure 121 is located on the planarization layer 14; or, in some other embodiments, the first blocking structure 121 is located on the pixel defining layer 3; or, in some other embodiments, some first blocking structures 121 are located on the planarization layer, and the other first blocking structures 121 are located on the pixel defining layer 3. This arrangement of the blocking structure 12 is more flexible and more conducive to the practical production process.

Figure 8:
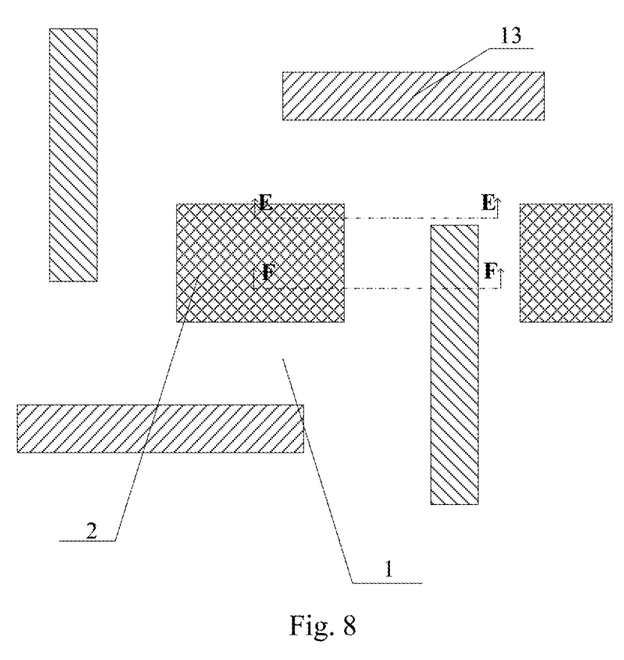
FIG. 8 is a simplified top view of positional arrangement of a light emitting structure and multiple openings in a display panel.
Figure 9:
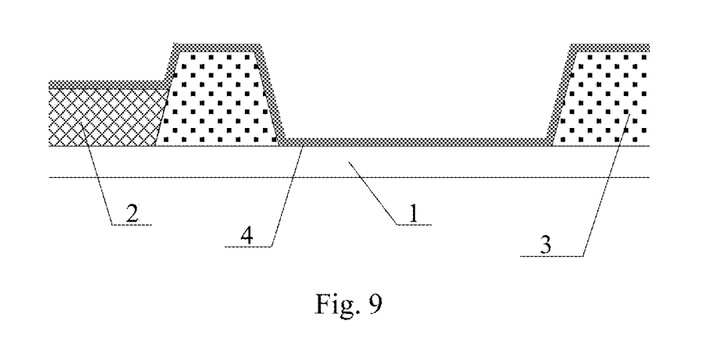
FIG. 9 is a sectional view taken along line E-E of FIG. 8.
Figure 10:
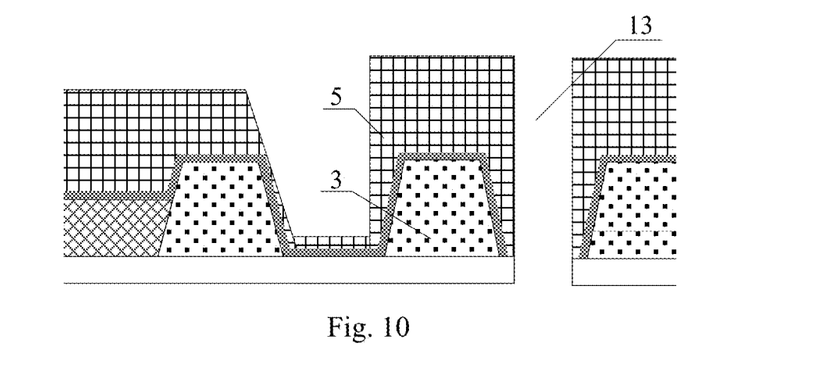
FIG. 10 is a sectional view taken along line F-F of FIG. 8.

FIG. 8 shows a simplified top view of positional arrangement of a light emitting structure and multiple openings 13 in a display panel, and FIG. 9 and FIG. 10 respectively show sectional views taken along line E-E and line F-F of FIG. 8. In order to enhance the elasticity of the stretchable display panel, as shown in FIG. 8 to FIG. 10, multiple openings 13 may be provided around the light emitting structure 2. Specifically, in some embodiments of the present disclosure, the openings 13 are at least provided in peripheral regions of some of the light emitting structures 2 and may penetrate the planarization layer or the flexible substrate. In practical designing, the openings 13 may be provided in peripheral regions of all the light emitting structures 2. In some embodiments of the present disclosure, the blocking structure may include a second blocking structure 122, and the second blocking structure 122 is arranged around the opening 13.

In some embodiments of the present disclosure, the opening 13 may have a rectangular shape, where the rectangular opening 13 may have a length of 50 to 1000 micrometers and a width of 20 to 200 micrometers. The blocking structure 12 may be disposed around the opening 13 based on design points of some embodiments of the present disclosure.

Figure 11:
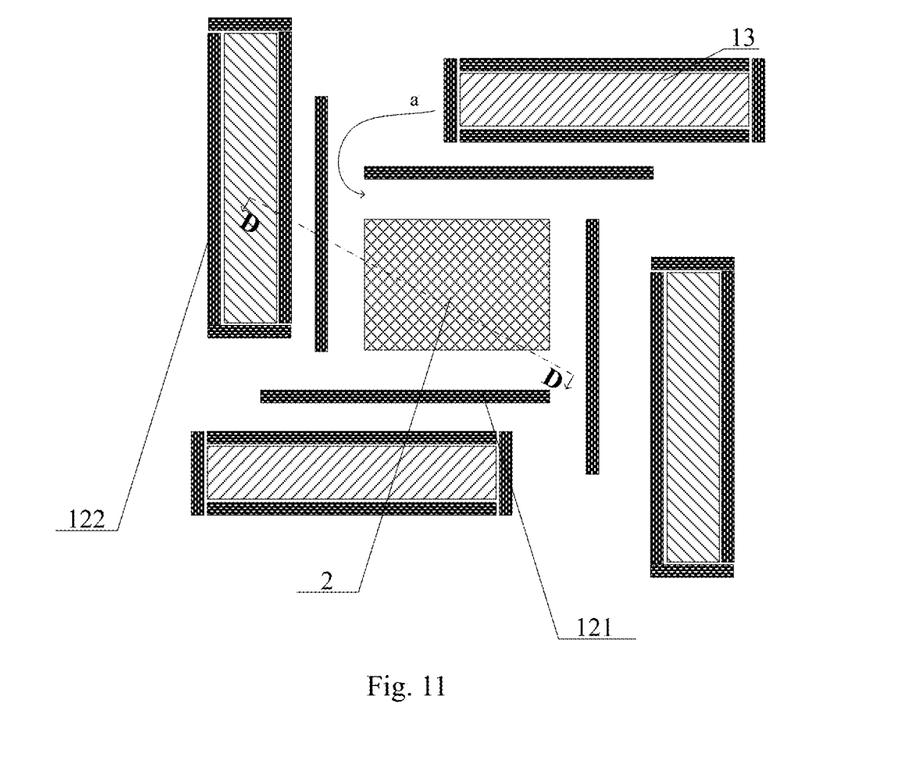
FIG. 11 is a top view of the light emitting structure of FIG. 8 and blocking structures arranged around.
Figure 12:
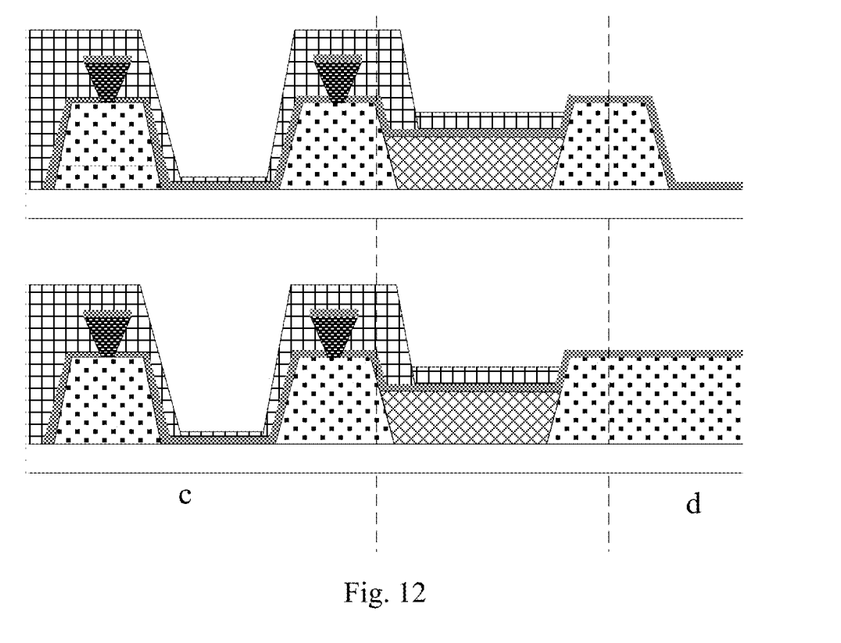
FIG. 12 is a sectional view taken along line D-D of FIG. 11 of a display panel according to some embodiments of the present disclosure.
Figure 13:
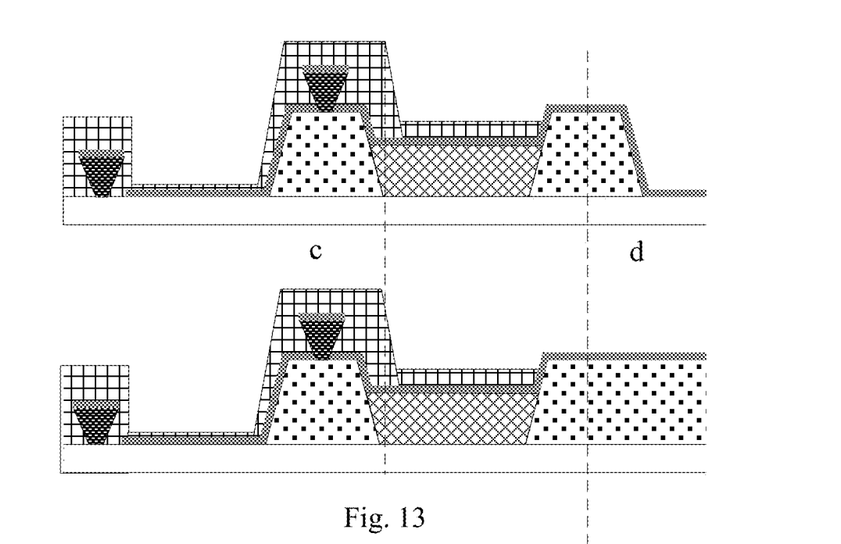
FIG. 13 is a sectional view taken along line D-D of FIG. 11 of a display panel according to some embodiments of the present disclosure.

As shown in FIG. 11 to FIG. 13, a blocking structure 12 is disposed between the light emitting structure 2 and the opening 13. Since the blocking structure 12 is provided, the length of the moisture erosion path a from the opening 13 is increased, further enhancing the overall packaging performance of the display panel.

As shown in FIG. 11 to FIG. 13, a cathode blocking region c and a cathode non-blocking region d may be formed in the display panel by using the blocking structure 12 according to requirements of practical use, where the cathode blocking region c includes two blocking structures 12. Multiple blocking structures 12 may be provided at different locations of a critical packaging region to increase packaging flexibility without increasing packaging cost and process difficulty. In the embodiment shown in FIG. 12, the blocking structures 12 may all be located on the pixel defining layer 3. In the embodiment shown in FIG. 13, some of the blocking structures 12 may be located on the substrate 1 and others may be located on the pixel defining layer 3.

Figure 14:
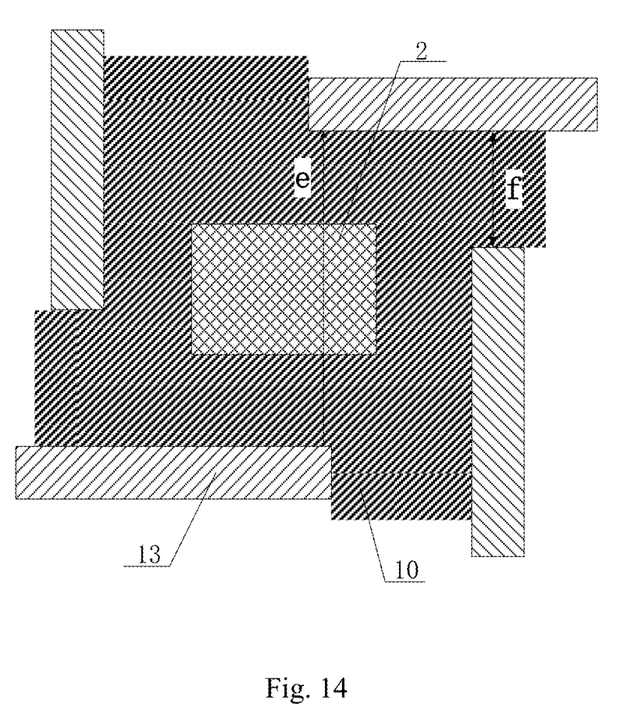
FIG. 14 is a top view of the display panel of FIG. 8 coated with an organic layer.
Figure 15:
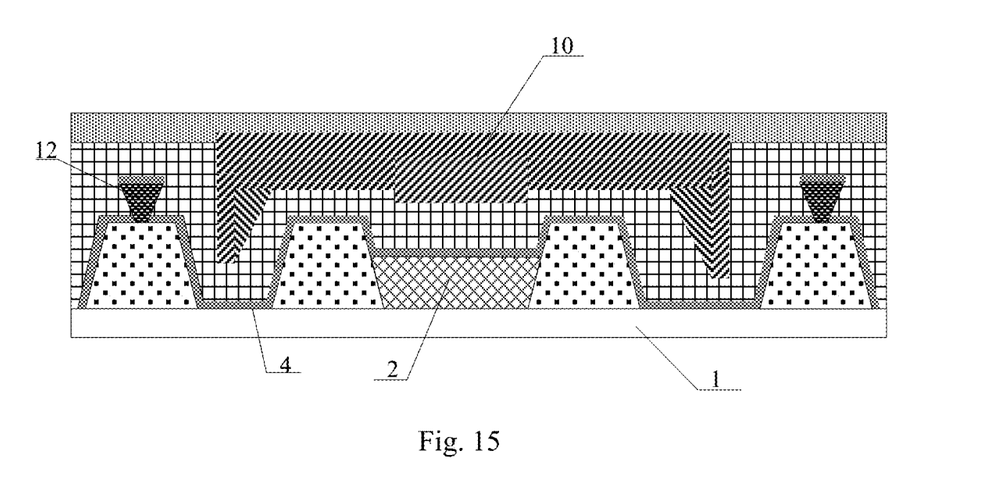
FIG. 15 is a sectional view of a display panel in which an organic layer is restricted by a blocking structure according to some embodiments of the present disclosure.

In addition, the blocking structure 12 according to some embodiments of the present disclosure can not only discontinue and lengthen the moisture erosion path, but also restrict an applying range of the organic material in the first organic layer 10 within the region of a light emitting layer of the light emitting structure 2. FIG. 14 and FIG. 15 respectively illustrate a top view of the display panel of FIG. 8 coated with an organic layer and a sectional view of the display panel in which the organic layer is restricted by the blocking structure according to some embodiments of the present disclosure.

As shown in FIG. 14 and FIG. 15, since the blocking structure 12 is disposed between the light emitting structure 2 and a packaging layer, and the blocking structure 12 has a certain height, the applying range of the organic material in the packaging layer is restricted only on an inorganic thin film electroluminescent layer of the light emitting structure. By providing a structure to restrict applying of the organic material, process difficulty and manufacturing cost of manufacturing the flexible display are reduced. In addition, in some embodiments of the present disclosure, a dimension e of the organic material of the first organic layer 10 applied on the patterned light-emitting layer is 100 to 1000 micrometers, and a width f of a connection bridge between two adjacent openings is 20 to 500 micrometers.

The display panel according to some embodiments of the present disclosure further includes a packaging layer on the cathode layer 4 and covering the substrate 1. The packaging layer includes multiple inorganic and organic layers which are alternately stacked, where only the first inorganic layer 5, the first organic layer 10 and the second inorganic layer 11 which are stacked are shown in the drawings.

A display device is further provided according to the present disclosure, which includes the display panel as described above. By the blocking structure 12 of the above display panel, the overall packaging performance of the display device is increased, and the space required for encapsulating the light emitting structure is reduced.

Figure 16:
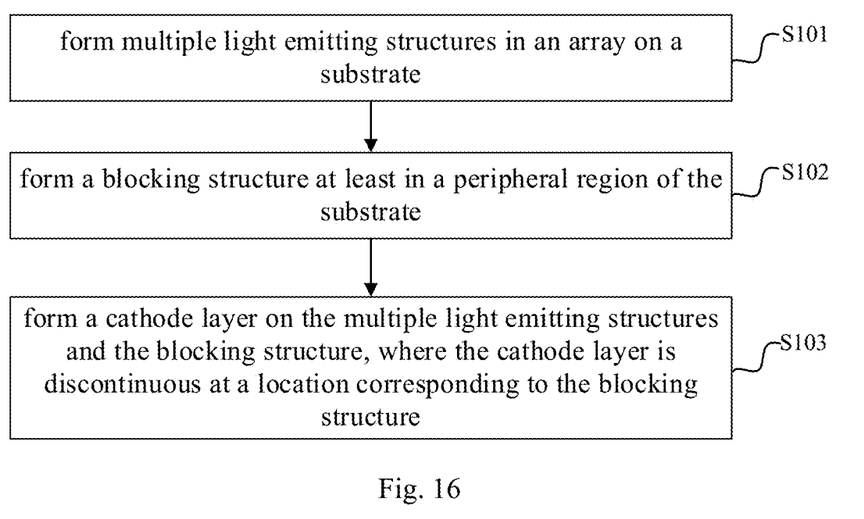
FIG. 16 is a flowchart of a method for manufacturing a display panel according to some embodiments of the present disclosure.

A method for manufacturing a display panel is further provided according to the present disclosure, which may be applied to manufacturing the display panel as described above. As shown in FIG. 16, the method includes:

step S101, forming multiple light emitting structures in an array on a substrate;

step S102, forming a blocking structure, where the blocking structure is at least arranged in a peripheral region of the substrate; and step S103, forming a cathode layer on the multiple light emitting structures and the blocking structure, where the cathode layer is discontinuous at a location corresponding to the blocking structure.

In practical application, the specific method for manufacturing the light emitting structure is similar to the related technologies, which is not described herein redundantly.

In specific implementation, the blocking structure may be formed by a patterning process when forming the blocking structure in step S102.

In specific implementation, the method for manufacturing the cathode layer is similar to the related technologies when forming the cathode layer on the multiple light emitting structures and the blocking structure in step S103, and the difference therebetween lies in that the cathode layer is discontinuous at a location corresponding to the blocking structure as the blocking structure is formed before the cathode layer, which can break the water-oxygen erosion path and improve water and oxygen blocking performance of the display panel.

The following beneficial effects can be obtained by implementing some embodiments of the present disclosure.

Firstly, the blocking structure is provided in the display panel of the embodiments of the present disclosure, the blocking structure is located at least in the peripheral region of the substrate, and the cathode layer is discontinuous at a location corresponding to the blocking structure. Compared with the related technologies, the blocking structure can block the destructive water-oxygen erosion path in the related technologies, improve the water and oxygen blocking performance of the display panel, and enhance the overall packaging performance of the display panel without damaging the elasticity of the display panel and the packaging space of each light emitting structure. In addition, a high-resolution pixel-level packaging structure can be achieved, thereby meeting the design requirements of narrow bezel.

Secondly, the orthographic projection area of the top surface of the blocking structure onto the substrate in the embodiments of the present disclosure is larger than the orthographic projection area of the bottom surface of the blocking structure onto the substrate. When coating the cathode layer on the light emitting structures and the blocking layer, the cathode layer will not completely cover the bottom of the blocking structure, so that a part of the substrate is exposed at the bottom of the blocking structure. Then, when coating the packaging layer, the packaging layer can completely enclose the blocking structure, improving the performance of blocking the water-oxygen erosion path. In addition, since the inorganic layer of the packaging layer has stronger adhesion than the cathode layer, fastness between the packaging layer and the substrate is enhanced.

Thirdly, the blocking structure may be disposed not only around the light emitting structure, but also at the opening or other corresponding positions, which can increase the length of the water-oxygen erosion path and further enhance the overall packaging performance of the display panel.

Fourthly, the blocking structure is disposed between the light emitting structure and the encapsulating layer, and the blocking structure has a certain height, thereby restricting the applying range of the organic material in the packaging layer, thus, the organic material is only coated on the inorganic thin film electroluminescent layer of the light emitting structure, and the coating restriction of the organic material is provided, which reduces the process difficulty and manufacturing cost of manufacturing the flexible display.

The above described are only some embodiments of the present disclosure. It should be noted that those skilled in the art can make various improvements and polishments without departing from the principle of the present disclosure, and those improvements and polishments shall also fall within the protection scope of the present disclosure.

What is claimed is:

1. A display panel, comprising:
    a substrate;
    a plurality of light emitting structures arranged in an array on the substrate;
    a blocking structure, at least arranged in a peripheral region of the substrate; and
    a cathode layer, arranged on the plurality of light emitting structures and the blocking structure,
    wherein the cathode layer is discontinuous at a location corresponding to the blocking structure, and
    wherein a material of the blocking structure comprises photoresist.

2. The display panel according to claim 1, wherein the blocking structure comprises a first blocking structure arranged in peripheral regions of at least a part of the plurality of light emitting structures.

3. The display panel according to claim 1, wherein an orthographic projection area of a top surface of the blocking structure onto the substrate is larger than an orthographic projection area of a bottom surface of the blocking structure onto the substrate.

4. The display panel according to claim 3, wherein a cross-sectional shape of the blocking structure is an inverted trapezoid or a columnar structure having a mushroom head.

5. The display panel according to claim 3, wherein there is a gap between the cathode layer and a side wall of the blocking structure.

6. The display panel according to claim 1, further comprising a pixel defining layer arranged in peripheral regions of the plurality of light emitting structures,
    wherein the blocking structure is arranged on the pixel defining layer.

7. The display panel according to claim 1, further comprising a planarization layer and a pixel defining layer,
    wherein the planarization layer is arranged between the substrate and the light emitting structures,
    the pixel defining layer is arranged on the planarization layer and in peripheral regions of the plurality of light emitting structures, and the blocking structure is arranged on the planarization layer.

8. The display panel according to claim 1, wherein an opening is provided in a peripheral region of each of at least a part of the plurality of light emitting structures, and
the blocking structure comprises a second blocking structure around the opening.

9. The display panel according to claim 1, further comprising a packaging layer arranged on the cathode layer and covering the substrate.

10. A display device, comprising the display panel according to claim 1.

11. A display panel, comprising:
a substrate;
a plurality of light emitting structures arranged in an array on the substrate;
a blocking structure, at least arranged in a peripheral region of the substrate; and
a cathode layer, arranged on the plurality of light emitting structures and the blocking structure,
wherein an orthographic projection area of a top surface of the blocking structure onto the substrate is larger than an orthographic projection area of a bottom surface of the blocking structure onto the substrate, and
wherein the cathode layer is in contact with a side wall of the blocking structure.

12. A method for manufacturing a display panel, comprising:
forming a plurality of light emitting structures in an array on a substrate;
forming a blocking structure, wherein the blocking structure is at least arranged in a peripheral region of the substrate; and
forming a cathode layer on the plurality of light emitting structures and the blocking structure,
wherein the cathode layer is discontinuous at a location corresponding to the blocking structure, and
wherein a material of the blocking structure comprises photoresist.

13. The method according to claim 12, wherein the blocking structure comprises a first blocking structure arranged in peripheral regions of at least a part of the plurality of light emitting structures.

14. The method according to claim 12, wherein an orthographic projection area of a top surface of the blocking structure onto the substrate is larger than an orthographic projection area of a bottom surface of the blocking structure onto the substrate.

15. The method according to claim 14, wherein a cross-sectional shape of the blocking structure is an inverted trapezoid or a columnar structure having a mushroom head.

16. The method according to claim 14, wherein the cathode layer is in contact with a side wall of the blocking structure or there is a gap between the cathode layer and the side wall of the blocking structure.

17. The method according to claim 12, further comprising forming a pixel defining layer,
wherein the pixel defining layer is arranged in peripheral regions of the plurality of light emitting structures, and
the blocking structure is arranged on the pixel defining layer.

18. The method according to claim 12, further comprising forming a planarization layer and a pixel defining layer,
wherein the planarization layer is arranged between the substrate and the light emitting structures,
the pixel defining layer is arranged on the planarization layer and in peripheral regions of the plurality of light emitting structures, and
the blocking structure is arranged on the planarization layer.

19. The method according to claim 12, wherein an opening is provided in a peripheral region of each of at least a part of the plurality of light emitting structures, and
the blocking structure comprises a second blocking structure around the opening.

* * * * *